United States Patent [19]
Fullerton et al.

[11] Patent Number: 5,025,296
[45] Date of Patent: Jun. 18, 1991

[54] CENTER TAPPED FET

[75] Inventors: Craig L. Fullerton, Scottsdale; Warren L. Seely, Chandler, both of Ariz.

[73] Assignee: Motorola, Inc., Schaumburg, Ill.

[21] Appl. No.: 577,840

[22] Filed: Sep. 4, 1990

Related U.S. Application Data

[63] Continuation of Ser. No. 161,826, Feb. 29, 1988, abandoned.

[51] Int. Cl.⁵ ............... H01L 29/80; H01L 29/78; H01L 27/10
[52] U.S. Cl. .................... 357/23.8; 357/22; 357/40; 357/41; 357/45; 357/47; 357/65; 357/71
[58] Field of Search ............ 357/22 E, 22 H, 23.8, 357/41, 45, 40, 47, 65, 71

[56] References Cited

U.S. PATENT DOCUMENTS

| | | | |
|---|---|---|---|
| 4,015,278 | 3/1977 | Fukuta | 357/22 E |
| 4,152,714 | 5/1979 | Hendrickson et al. | 357/23.8 |
| 4,684,965 | 8/1987 | Tajima et al. | 357/22 H |
| 4,701,777 | 10/1987 | Takayama et al. | 357/45 |
| 4,807,022 | 2/1989 | Kazior et al. | 357/22 H |
| 4,845,536 | 7/1989 | Heinecke et al. | 357/23.8 |
| 4,857,981 | 8/1989 | Matsumoto et al. | 357/45 |

FOREIGN PATENT DOCUMENTS

| | | | |
|---|---|---|---|
| 0265833 | 5/1988 | European Pat. Off. | 357/23.8 |
| 56-12776 | 2/1981 | Japan | 357/22 E |
| 57-12553 | 1/1982 | Japan | 357/23.8 |
| 57-37875 | 3/1982 | Japan | 357/23.8 |

Primary Examiner—Andrew J. James
Assistant Examiner—Ngan Van Ngo
Attorney, Agent, or Firm—Robert M. Handy; Maurice J. Jones

[57] ABSTRACT

A FET structure has first and second active areas separated by an inactive area with a gate bus located thereon. Gate fingers extend from the gate bus between source and drain contacts on the active areas. Bridges extend over the gate bus and interconnect the source contacts.

25 Claims, 2 Drawing Sheets

CENTER TAPPED FET

This application is a continuation of prior application Ser. No. 161,826, filed Feb. 29, 1988, now abandoned.

BACKGROUND OF THE INVENTION

This invention relates to structures for field effect transistors (FETs) and, more particularly, to the topology of such structures.

Research and development resources are being directed toward developing gallium arsenide structures because of the potentially high frequency and high density characteristics of these devices. Presently available gallium arsenide FETs utilized in monolithic microwave integrated circuits (MMICs) are of at least two basic types. The interdigitated type utilizes gate fingers which are fed from the ends thereof and provide a total gate width by paralleling as many fingers as desired. Another type utilizes a continuous gate line that is fed from one or more central points or pads. This latter configuration is generally limited to applications requiring lower gain and hence smaller gate widths than the interdigitated type. Each type has a continuous active area of semiconductor material.

Generally it is desired that structures operating at microwave frequencies be symmetrical to facilitate coupling, compactness and even field distributions to thereby reduce loss and other problems. Neither of the foregoing prior art FET structures are symmetrical about both axes. Moreover, such structures generally have limited high power operation because the continuous active areas thereof can only dissipate a limited amount of heat. Furthermore, such structures may require gate fingers of excessive "width" which tend to increase undesirable parasitic effects that result in increased source, drain and/or gate resistances, capacitances and/or inductances. Gate "width" is defined as the total "length" of the gate finger contact portions superimposed on active semiconductor material between source and drain electrode regions.

Furthermore, prior art structures sometimes use "air bridges" which are conductors elevated on posts that connect a plurality of active source regions to a source bus, for instance. These air bridges extend over the active drain regions in some prior art devices Hence, such structures tend to undesirably increase the drain-to-source capacitance and thereby limit the high frequency capabilities of prior art FETs. Moreover, these air bridges also undesirably tend to increase the source inductance, for instance. Additionally, the prior art air bridges undesirably tend to decrease the drain-to-source voltage breakdown characteristics.

SUMMARY OF THE INVENTION

Accordingly, one object of the present invention is to provide improved field effect semiconductor devices for operation at microwave frequencies.

Another object of the present invention is to provide FET configurations which have improved power dissipation characteristics making them suitable for high power applications.

Yet another object of the present invention is to provide FETs having topologies suitable for being utilized in MMIC applications.

A still further object of the present invention is to provide FETs which do not require air bridges spanning across active regions.

An additional object of the present invention is to provide FET configurations with high gains at microwave frequencies and which minimize undesirable parasitic effects and which have symmetrical topologies.

A particular embodiment of the present invention consists of a field effect transistor structure having first and second active semiconductor areas separated by an inactive area. First source and drain conductors are located on the first active semiconductor area. Second source and drain conductors are located on the second active area. A gate bus is located on the inactive area with first gate finger portions extending from the gate bus portion across the first active semiconductor area between the first source and drain conductors. Second gate finger portions extend from the gate bus across the second active semiconductor area between the second source and drain conductors. Bridges extend over the inactive area to interconnect the source contacts and other airbridges extend over the inactive area to interconnect the drain contacts.

BRIEF DESCRIPTION OF THE DRAWINGS

A more complete understanding of the present invention may be derived by reference to the detailed description and the claims when considered along with the accompanying drawings wherein like reference numbers designate similar parts.

DETAILED DESCRIPTION OF THE PREFERRED EMBODIMENT

Figure 1:
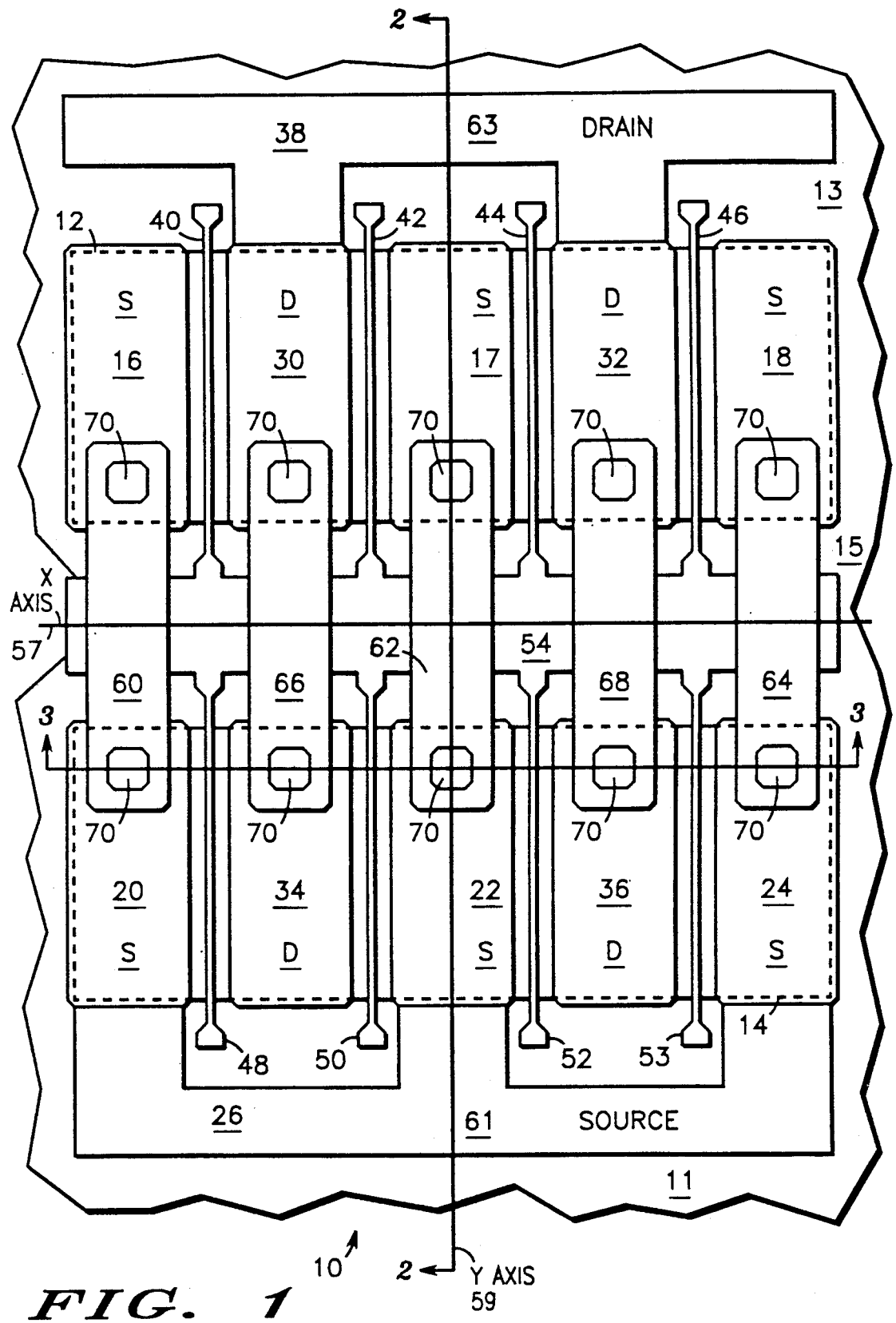
FIG. 1 is a topographical view of the metallization and active areas of a FET in accordance with the invention.

Referring now to the drawings, FIG. 1 is a topographical view of FET 10 which is provided in a substrate 11 made from a semiconductor material such as gallium arsenide Dashed rectangles 12 and 14 indicate active areas in the semiconductor material which are provided by an N-type diffusion, for instance. Inactive region 13 includes the generally rectangular area 15 located between active regions 12 and 14. Region 15 has parallel sides abutting the sides of rectangles 12 and 14 and other parallel sides joining the other sides of rectangles 12 and 14. Rectangular source contacts or conductors 16, 17, 18, 20, 22 and 24 can be made of gold which is patterned in a known manner such as by sputtering or by photolithographic techniques and provided over selected portions of active areas 12 and 14. Source bus 26 is provided over other portions of the inactive area outside of rectangles 12 and 14 and interconnects source contacts 20, 22 and 24. Furthermore, rectangular drain contacts 30, 32, 34 and 36 are likewise provided over other selected portions of active areas 12 and 14 in a known manner. Drain bus 38 is provided over another portion of the inactive region and interconnects drain contacts 30 and 32. The source and drain contacts provide ohmic contact with the active electrode regions underneath them.

A plurality of gate finger contact portions 40, 42, 44, 46, 48, 50, 52 and 53 extend over part of an inactive area 15 and over a selected portion of active regions 12 and 14 between adjacent source and drain contacts. Each gate finger contact portion makes a Schottky contact with the selected portion of the active region underneath it. Generally rectangular gate bus 54 which is located over part of the inactive region interconnects and can be integral with all of the gate finger portions. The gate finger portions and bus 54 can also be made from gold and patterned according to known techniques. Gate bus 54 is located centrally of oppositely disposed pairs of gate finger portions such as 40 and 48, 42 and 50, 44 and 52, and 46 and 53. This center tap configuration allows active areas 12 and 14 to be separated to facilitate power dissipation from each active area and enables FET 10 to have a symmetrical structure about the respective horizontal(X) and vertical(Y) axes 57 and 59. It will be apparent to those skilled in the art that this symmetry provides numerous advantages in microwave applications such as facilitating direct contact to coplanar waveguides, minimizing loss, providing even field distribution and reducing parasitics.

Air bridges 60, 62 and 64 respectively interconnect source contact pairs 16, 20; 17, 22; and 18, 24. Air bridges 60, 62 and 64 extend or span over gate bus 54 and inactive region 15. Similarly, air bridges 66 and 68 respectively interconnect drain electrode pairs 30, 34 and 32, 36 over gate bus 54 and inactive region 15. The air bridges or crossovers are elevated above the source and drain electrodes by octagon shaped posts 70 which are bonded to the metallization of the source or drain contacts and to the metal on the underside of the air bridge. Dielectric bridges could also be used.

Figure 2:
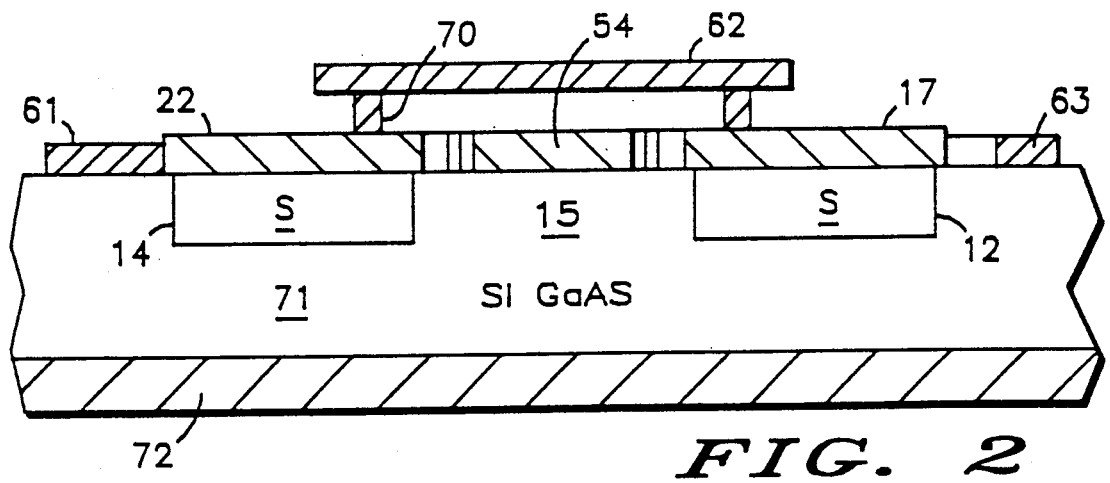
FIG. 2 is a cross-sectional drawing taken along lines 2—2 of FIG. 1.

FIG. 2 illustrates a cross-section of FET 10 of FIG. 1 along lines 2—2. FIG. 2 shows a cross-section of posts 70, portion 61 of source bus 26 and portion 63 of drain bus 38. Bridge 62 and posts 70 interconnect source contact 22 with source contact 17 over gate bus 54 and inactive region 15. Semiconductor substrate material 71 can be formed a layer of semi-insulating (SI) gallium arsenide having a metal layer 72 on the bottom surface thereof to provide a ground plane.

Figure 3:
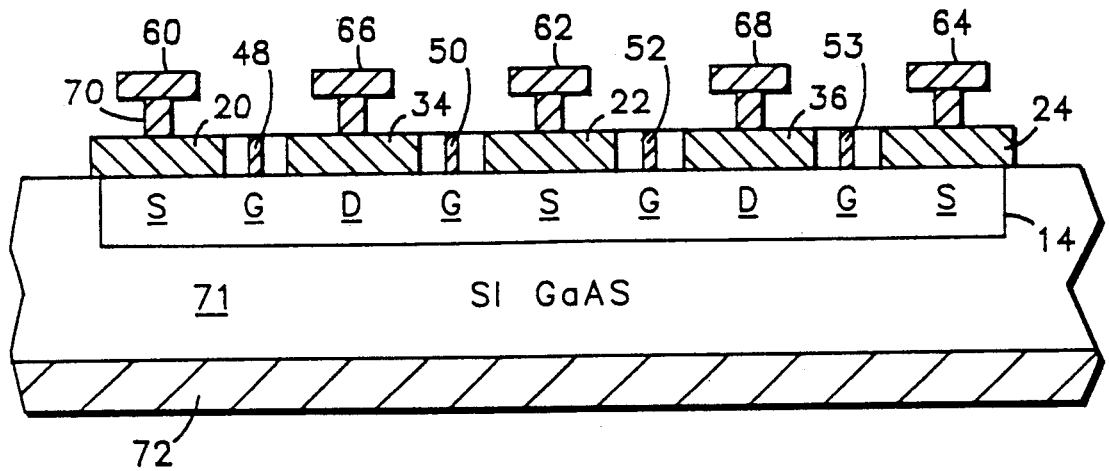
FIG. 3 is another cross-sectional view of the FET of FIG. 1 taken along lines 3—3.

FIG. 3 shows a cross-section of FET 10 of FIG. 1 along lines 3—3. More specifically, FIG. 3 shows the cross-sections of bridges 60, 66, 62, 68 and 64. The gate under finger 48 controls the depletion regions between the source under contact 20 and the drain under contact 34, the gate under contact 50 controls the depletion region between the source region under contact 22 and the drain region under contact 34, the gate under contact 52 controls the depletion region between the source region under contact 22 and the drain region under contact 36 and the gate under contact 53 controls the depletion region between the source under contact 24 and the drain under contact 36.

Figure 4:
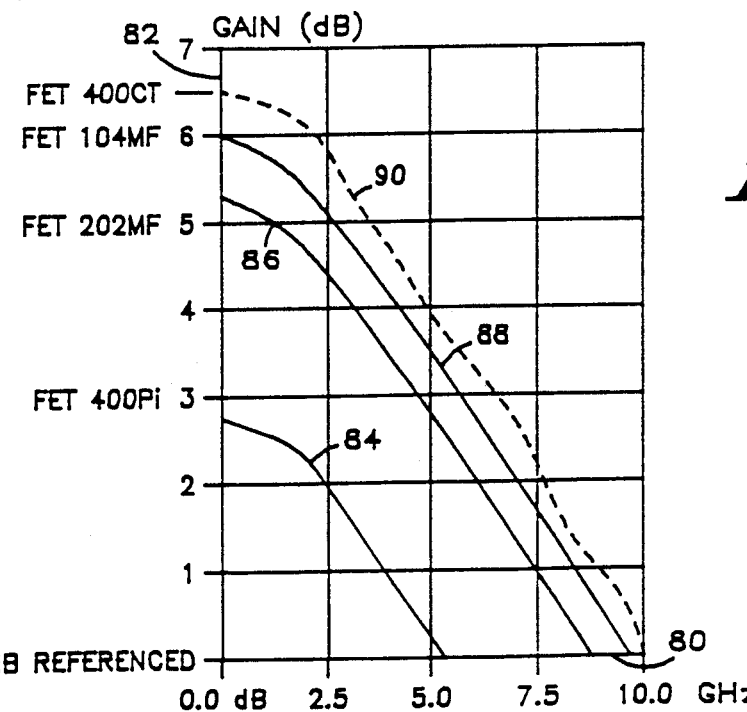
FIG. 4 is a graph showing the gain versus frequency response of a FET having the configuration shown in FIG. 1 as compared to the responses of some prior art FET configurations.

FIG. 4 includes an abscissa axis 80 designating frequency in gigahertz (GHz) and an ordinate axis 82 indicating gain as a function of dB. Graph 84 indicates the gain versus frequency characteristic of a prior art structure having a gate width of 400 micrometers wherein the gate is one continuous strip between the source and drain that is fed from two points located along the gate thereby forming a so-called "Pi" gate because of the topographical appearance thereof. As shown by curve 84, this so-called Pi configuration has a zero dB response at a little over 5 GHz and maximum gain of less than 3 dB. Curve 86 represents the gain versus frequency response for a prior art interdigitated or multi-finger (MF) FET having two fingers, each with a gate width of approximately 200 micrometers. The maximum gain for this device is shown as over 5 dB and the zero dB response is at approximately 8.5 GHz. Curve 88 represents the gain versus frequency response for a prior art multi-finger, interdigitated FET having four gates fingers each having a gate width of approximately 100 micrometers. This prior art device has a maximum gain of approximately 6 dB and a zero dB response at about 9 GHz. Curve 90 represents the gain versus frequency characteristic for a center tapped (CT) FET 10 made in accordance with the invention having eight gate finger portions with a total gate width of 400 micrometers. FET 10 has approximately the same total gate width as the other prior art structures, but has an approximately 6.5 dB gain at zero frequency and a frequency response out to 10 GHz at zero dB gain.

FET 10 has improved characteristic partly because the disclosed air bridge structures over inactive region 15 provides decreased drain-to-source parasitic capacitances as compared to prior art structures having air bridges directly over the active drain regions. Moreover the disclosed air bridge structure provides this advantage without degrading the source resistance and/or inductance. The drain-to-source capacitance is reduced because the sources are connected by an air bridge, eg. 60, across the gate bus rather than across the drain. Furthermore, the air bridge from source-to-source not crossing the drain improves the drain-to-source voltage breakdown and therefore increase the power handling capability of FET 10 as compared to prior art structures. Also separation of the active areas 12 and 14 increases the power dissipation of FET 10 as compared to devices having a single, continuous active area.

FET 10 has low source inductance because of the direct interconnection of the sources across the center tapped gate bus 54. The individual gate finger "widths", which is the lengths of the portions of the gate fingers crossing active areas 12 and 14 is kept to a minimum in FET 10 to prevent radio frequency attentuation and phase shift due to gate resistance and capacitance while still enabling FET 10 to provide sufficient gain which is proportional to total gate width. Such gate resistance and capacitance tends to provide increased signal degradation with increases in frequency. Thus, by minimizing the gate finger width of each individual gate finger portion, the electrical parameters of FET 10 are thereby optimized so that FET 10 is suitable for use in MMIC applications.

While the invention has been particularly shown and described with reference to preferred embodiments, those skilled in the art will understand that changes in form and details may occur therein without departing from the scope of the present invention.

We claim:
1. A field effect transistor including in combination:
a first active semiconductor area;
a first source conductor and a first drain conductor located on said first active semiconductor area;
a second active semiconductor area located adjacent to but separated from said first active semiconductor area;
a second source conductor and a second drain conductor located on said second active semiconductor area;
an inactive area located between said first active semiconductor area and said second active semiconductor area;

gate bus means located on said inactive area;

first gate finger contact means extending from said gate bus means in a first direction across a portion of said inactive area and across a portion of said first active semiconductor area between said first source conductor and said first drain conductor;

second gate finger contact means extending from said gate bus means in a direction opposite to said first direction across a portion of said inactive area and across a portion of said second active semiconductor area between said second source area and said second drain area; and said gate finger contact means and said source and drain conductors all being located in the same plane.

2. The field effect transistor of claim 1 further including bridge means extending across a portion of said inactive area and electrically connecting said first drain conductor to said second drain conductor.

3. The field effect transistor of claim 2 wherein said bridge means further extends across a portion of said gate bus means.

4. The field effect transistor structure of claim 1 further including bridge means extending across a portion of said inactive area between and electrically connecting said first source conductor to said second source conductor.

5. The field effect transistor structure of claim 4 wherein said bridge means further extends across a portion of said gate bus means.

6. The field effect transistor of claim 1 wherein:

said first source conductor and said first drain conductor each have rectangular shapes that are located adjacent to each other but separated by a selected portion of said first active semiconductor area and said first gate finger contact means extending in a first direction over said selected portion of said first active semiconductor area; and said second source conductor and said second drain conductor each have rectangular shapes that are located adjacent to each other, but separated by a selected portion of said second active semiconductor area and said second gate finger contact means extending in a second direction over said selected portion of said second active semiconductor area.

7. The field effect transistor structure of claim 1 further including:

additional drain and source conductors located on said first active semiconductor area;

further drain and source conductors located on said second active semiconductor area; and additional gate finger contact means extending from said gate bus means between said additional drain and source conductors and said further drain and source conductors.

8. The field effect transistor of claim 1 wherein said inactive area is comprised of inactive semiconductor material, said active area is comprised of active semiconductor material.

9. The field effect transistor of claim 8 wherein said active semiconductor material and said inactive semiconductor material is gallium arsenide.

10. A field effect transistor for operating at high power levels at microwave frequencies including in combination:

a generally rectangular area of inactive material;

gate bus means extending along a first axis over said rectangular area of inactive material;

a first area of active semiconductor material having a rectangular area located adjacent to one side of said inactive material;

first source and drain contacts located on said first area of active semiconductor material;

a second area of active semiconductor material having a rectangular area located adjacent to another side of said inactive material, said inactive material thereby separating said first and second areas of active semiconductor material to facilitate power dissipation by said first and second active areas of semiconductor material;

second source and drain contacts located on said second area of active semiconductor material;

first gate finger means extending perpendicular to said first axis in a first direction between said first source and drain contacts;

second gate finger means extending perpendicular to said first axis in a second direction between said second source and drain contacts;

a plurality of bridging means extending over said rectangular inactive area and interconnecting said first source contacts with said second source contacts and said first drain contacts with said second drain contacts; and said gate finger means and said source and drain contacts all being located in the same plane.

11. The field effect transistor structure of claim 10 wherein said gate bus means, said gate finger means, said bridging means and said source and drain contacts all have substantially rectangular configurations that are oriented perpendicular to and symmetrically with said first axis to facilitate utilization of the field effect transistor at the microwave frequencies.

12. The field effect transistor of claim 10 further having a second axis perpendicular to said first axis and wherein said gate bus means, said gate finger means, said bridging means and said source and drain contact means are oriented substantially symmetrically with said second axis to further facilitate utilization at the microwave frequencies.

13. The field effect transistor of claim 10 being included in a monolithic integrated circuit.

14. The field effect transistor of claim 10 further including:

drain bus means located adjacent to said first area of active semiconductor material and interconnecting said drain contacts; and source bus means located adjacent to said second area of active semiconductor material and interconnecting said source contacts.

15. The field effect transistor structure of claim 10 further including:

first bridge means extending entirely across said inactive area between and interconnecting said first and second source contacts; and second bridge means extending entirely across said inactive area between and interconnecting said first and second drain contacts.

16. The field effect transistor of claim 1 further including conductive means electrically connecting said first drain conductor to said second drain conductor.

17. The field effect transistor of claim 16 wherein said conductive means includes airbridge means.

18. The field effect transistor of claim 1 further including conductive means electrically connecting said first source conductor to said second source conductor.

19. The field effect transistor of claim 16 wherein said conductive means extends across a portion of said gate means.

20. A field effect transistor for operating at microwave frequencies including in combination:
an area of inactive material having opposite sides;
gate bus means extending along a first axis over said area of inactive material;
a first area of active semiconductor material having a rectangular area located adjacent to one side of said area of inactive material;
first source and drain contacts located on said first area of active semiconductor material;
a second area of active semiconductor material having a rectangular area located adjacent to another side opposite to said one side of said inactive material;
second source and drain contacts located on said second area of active semiconductor material;
first gate finger means extending perpendicular to said first axis in a first direction between said first source and drain contacts;
second gate finger means extending perpendicular to said first axis in a second direction between said second source and drain contacts;
first means interconnecting said first source contacts with said second source contacts;
second means interconnecting said first drain contacts with said second drain contacts; and
said gate finger means and said source and drain contacts all being located in the same plane.

21. The field effect transistor of claim 20 wherein said gate bus means and said gate finger means are oriented perpendicular to and symmetrically with said first axis to facilitate utilization of the field effect transistor at the microwave frequencies.

22. The field effect transistor of claim 20 further having a second axis perpendicular to said first axis and wherein said gate bus means and said gate finger means are oriented substantially symmetrically with said second axis to facilitate utilization of the field effect transistor at the microwave frequencies.

23. The field effect transistor of claim 20 being included in a monolithic integrated circuit.

24. The field effect transistor of claim 20 further including:
drain bus means interconnecting said drain contacts; and
source bus means interconnecting said source contacts.

25. The field effect transistor structure of claim 20 further including:
a further inactive area; and
said first interconnecting means located on said further inactive area and interconnecting said source contacts.

* * * * *

UNITED STATES PATENT AND TRADEMARK OFFICE
CERTIFICATE OF CORRECTION

PATENT NO. : 5,025,296

DATED : June 18, 1991

INVENTOR(S) : Craig L. Fullerton et al.

It is certified that error appears in the above-identified patent and that said Letters Patent is hereby corrected as shown below:

```
In column 5, claim 4, line 1, delete "structure".
In column 5, claim 5, line 1, delete "structure".
In column 5, claim 7, line 1, delete "structure".
In column 6, claim 11, line 1, delete "structure".
```

Signed and Sealed this

First Day of September, 1992

Attest:

DOUGLAS B. COMER

*Attesting Officer*   Acting Commissioner of Patents and Trademarks